United States Patent
Giebeler et al.

(10) Patent No.: US 9,842,959 B2
(45) Date of Patent: Dec. 12, 2017

(54) METHOD FOR PRODUCING A MICROSYSTEM HAVING PIXELS

(71) Applicant: Pyreos Ltd., Edinburgh (GB)

(72) Inventors: Carsten Giebeler, Edinburgh (GB); Neil Conway, Fife (GB)

(73) Assignee: Pyreos, Ltd., Edinburgh (GB)

( * ) Notice: Subject to any disclaimer, the term of this patent is extended or adjusted under 35 U.S.C. 154(b) by 128 days.

(21) Appl. No.: 15/011,812

(22) Filed: Feb. 1, 2016

(65) Prior Publication Data
US 2016/0149071 A1  May 26, 2016

Related U.S. Application Data

(63) Continuation of application No. PCT/EP2014/066084, filed on Jul. 25, 2014.

(30) Foreign Application Priority Data

Aug. 1, 2013  (DE) .................. 10 2013 108 280

(51) Int. Cl.
| H01L 21/64 | (2006.01) |
| H01L 31/18 | (2006.01) |

(Continued)

(52) U.S. Cl.
CPC ............ *H01L 31/1884* (2013.01); *G01J 1/44* (2013.01); *G01J 5/023* (2013.01); *G01J 5/024* (2013.01);
(Continued)

(58) Field of Classification Search
CPC .................................................. H01L 31/1884
See application file for complete search history.

(56) References Cited

U.S. PATENT DOCUMENTS

| 2011/0049369 A1 | 3/2011 | Giebeler et al. |
| 2012/0161002 A1 | 6/2012 | Yoshizaki |
| (Continued) |

FOREIGN PATENT DOCUMENTS

| DE | 19525071 A1 | 1/1997 |
| DE | 10103529 A1 | 8/2002 |
| DE | 10 2007 046 451 A1 | 4/2009 |

OTHER PUBLICATIONS

International Search Report in counterpart International Application No. PCT/EP2014/066084, dated Jan. 28, 2015.

*Primary Examiner* — Marc Armand
*Assistant Examiner* — Sarah Salerno
(74) *Attorney, Agent, or Firm* — Edell, Shapiro & Finnan, LLC

(57) ABSTRACT

A Method for producing a microsystem (1) with pixels includes: producing a thermal silicon oxide layer on the surface of a silicon wafer as a base layer (5) by oxidation of the silicon wafer; producing a silicon oxide thin layer on the base layer as a carrier layer (6) by thermal deposition; producing a platinum layer on the carrier layer by thermal deposition, whereby an intermediate product is produced; cooling the intermediate product to room temperature; pixel-like structuring of the platinum layer by removing surplus areas of the platinum layer, whereby bottom electrodes (8, 12) of the pixels (7, 8) are formed in pixel shape on the carrier layer in remaining areas; removing material on the side of the silicon wafer facing away from the base layer, so a frame (3) remains and a membrane (4) formed by the base layer and the carrier layer is spanned by the frame.

8 Claims, 2 Drawing Sheets

(51) Int. Cl.
  *G01J 5/34* (2006.01)
  *H01L 37/02* (2006.01)
  *G01J 5/04* (2006.01)
  *G01J 1/44* (2006.01)
  *G01J 5/02* (2006.01)
  *H01L 41/316* (2013.01)

(52) U.S. Cl.
  CPC .............. *G01J 5/046* (2013.01); *G01J 5/34* (2013.01); *H01L 37/02* (2013.01); *H01L 37/025* (2013.01); *G01J 2005/345* (2013.01); *H01L 41/316* (2013.01)

(56) References Cited

U.S. PATENT DOCUMENTS

2012/0319535 A1* 12/2012 Dausch ................ B06B 1/0622
  310/365
2013/0023063 A1   1/2013 Matsushima et al.

* cited by examiner

METHOD FOR PRODUCING A MICROSYSTEM HAVING PIXELS

CROSS REFERENCE TO RELATED APPLICATIONS

This is a Continuation of International Application PCT/EP2014/066084, which has an international filing date of Jul. 25, 2014, and the disclosure of which is incorporated in its entirety into the present Continuation by reference. The following disclosure is also based on and claims the benefit of and priority under 35 U.S.C. §119(a) to German Patent Application No. DE 10 2013 108 280.7, filed Aug. 1, 2013, which is also incorporated in its entirety into the present Continuation by reference.

FIELD AND BACKGROUND OF THE INVENTION

The invention relates to a method for producing a microsystem with pixels.

Thin layers made out of lead-zirconate-titanate (PZT) are widely used in the microsystem technology due to their advantageous physical properties, for example a high electromechanical coupling, a high dielectric constant or a high pyroelectric coefficient. A microsystem conventionally comprises a substrate as a carrier for the thin film, wherein the substrate comprises a membrane that is spanned by a silicon frame. It is known to deposit the lead-zirconate-titanate-thin layer on the substrate by a deposition method, in particular a sputtering process. A grid-like arrangement of pixels out of the thin layer is conventionally achieved by a photolithographic etching method. The pixels are electronically interconnected with electrodes that are, for example, made out of platinum or a chrome-nickel-alloy.

It is necessary that the membrane has a small thermal mass and a low thermal conductivity, so that thermal crosstalk between the pixels is low. This is achieved by the membrane being formed out of a poorly heat conducting material, for example silicon oxide, and being formed as thin as possible. The thickness of the membrane is typically 1 μm with a frame height of 400 μm. It is possible to structure the rear side of the substrate so strongly anisotropic that cavities can be formed using a deep reactive ion etching method. The cavities immediately extend to the membrane, so that the membrane is exposed on its side facing away from the pixels. It is desirable to make the membrane as thin as possible and with a sufficient high solidity, so that the pixels have a high functionality due to the low crosstalk.

In order to stabilize the membrane it is known to provide an additional $Si_3N_4$-layer on the substrate. However, the additional $Si_3N_4$-layer has the disadvantage that its heat conductivity is so high that the disadvantageous crosstalk between the single pixels is increased. Furthermore, producing the additional $Si_3N_4$-layer requires a further manufacturing step, whereby higher manufacturing costs are involved.

SUMMARY

It is an object of the invention to provide a method for producing a microsystem with pixels, wherein the pixels have a high functionality and the microsystem has a high mechanical stability even though the manufacturing costs therefor are low.

The object is solved with the features of the independent patent claim. Preferred embodiments thereto are set forth in the further patent claims.

The method according to the invention for producing the microsystem with the pixels comprises: providing a silicon wafer; producing a thermal silicon oxide layer on the surface of the silicon wafer as a base layer with a thickness between 200 nm and 1000 nm by oxidation of the silicon wafer; producing a silicon oxide thin layer directly on the base layer as a carrier layer with a thickness between 100 nm and 700 nm by a thermal deposition method; producing a platinum layer directly on the carrier layer with a thermal deposition method with a thickness between 40 nm and 200 nm, whereby an intermediate product comprising the silicon wafer, the base layer, the carrier layer and the platinum layer is produced; cooling the intermediate product to room temperature; structuring the platinum layer with pixels by removing surplus areas of the platinum layer, whereby bottom electrodes of the pixels are formed in a pixel shape on the carrier layer in remaining areas; removing material on the side of the silicon wafer facing away from the base layer, so that a frame remains and a membrane formed by the base layer and the carrier layer is spanned by the frame; and finalizing of the microsystem.

During the production of the microsystem with the method according to the invention, the intermediate product results as a layer composite that comprises the base layer as the thermal silicon oxide layer with the thickness of 200 nm to 1000 nm, the carrier layer as the silicon oxide thin layer with the thickness from 100 nm to 700 nm and the platinum layer with the thickness from 40 nm to 200 nm, wherein the layers lie directly next to each other and are permanently connected with each other. After cooling of the intermediate product an according stress state arises in the layers, which is characterized in that both in the base layer and in the carrier layer compressive stresses are present, and in the platinum layer tensile stresses are present. The compressive stresses in the carrier layer are approximately five to ten times smaller than in the base layer and the tensile stresses in the platinum layer are about 5 to 20 MPa. It is further to be observed that after the structuring of the platinum layer to the platinum layer pixels as the bottom electrodes, tensile stresses are present in the bottom electrodes, which values compared to the tensile stresses in the platinum layer before the structuring are substantially unchanged. On the locations of the carrier layer and the base layer, on which the platinum layer pixels are arranged, an overcompensation of the compressive stresses in the base layer and the carrier layer from the tensile stresses in the platinum layer pixels recite such that tensile stresses and no compressive stresses are present. The platinum layer pixels with its tensile stresses therefore serve for the local compensation of the compressive stresses of the base layer and the carrier layer. The local compensation of the compressive stresses of the base layer and the carrier layer arises surprisingly by the platinum layer pixels, although the platinum layer is no longer continuously present on the surface after the structuring of the platinum layer pixels, but only in the shape of the platinum layer pixels. The tensile stresses that act on the carrier layer and the base layer due to the compensation effect of the platinum layer pixels have values to about 50 MPa.

The membrane has a high solidity as a result of the stress states generated in the membrane according to the invention, so that the membrane does not break for example during production of the microsystem, although the membrane is formed with such a low thickness according to the invention. The gradients of the stresses in the base layer and the carrier layer are also so moderate that the base layer and the carrier layer have a high mechanical stability. Furthermore, the carrier layer and the base layer have such a low heat conductivity that the crosstalk between the pixels is low. The microsystem has therefore an advantageous high signal-to-noise ratio, in particularly for frequencies that are lower than the thermal limit frequency. The method according to the invention for producing the microsystem comprises processing for producing the base layer and the carrier layer, whereby additional processes, for example for producing a mechanical stabilizing $Si_3N_4$-layer, are not necessary. The manufacturing costs of the microsystem according to the invention are therefore smaller than for known microsystems.

The platinum layer is preferably sputtered at 300° C. to 550° C. The method further preferably comprises: producing a lead-zirconate-titanate layer directly on the platinum layer with a thermal deposition method and a thickness from 0.2 μm to 5 μm, whereby the intermediate product comprises the lead-zirconate-titanate layer. It is hereby preferred that during the pixel-like structuring of the platinum layer, the lead-zirconate-titanate layer is simultaneously structured by removing of surplus areas of the lead-zirconate-titanate layer, whereby lead-zirconate-titanate pixels of the pixels are formed on the bottom electrodes by the remaining areas of the lead-zirconate-titanate layer.

The method further comprises preferably: producing a semitransparent, electrical conductive electrode layer directly on the lead-zirconate-titanate layer with a thermal deposition method, whereby the intermediate product comprises the electrode layer. It is hereby preferred that the electrode layer comprises platinum or a nickel-iron-compound or a nickel-chrome-compound. During the pixel-like structuring of the platinum layer and the lead-zirconate-titanate layer, the electrode layer is structured preferably simultaneously by removing surplus areas of the second platinum layer, whereby head electrodes of the pixels are formed on the lead-zirconate-titanate pixel in remaining areas of the second platinum layer.

It is furthermore preferred that the thermal deposition method is a sputter method.

BRIEF DESCRIPTION OF THE DRAWINGS

In the following a preferred embodiment of a microsystem made by the method according to the invention is explained with reference to schematic drawings.

DETAILED DESCRIPTION

Figure 1:
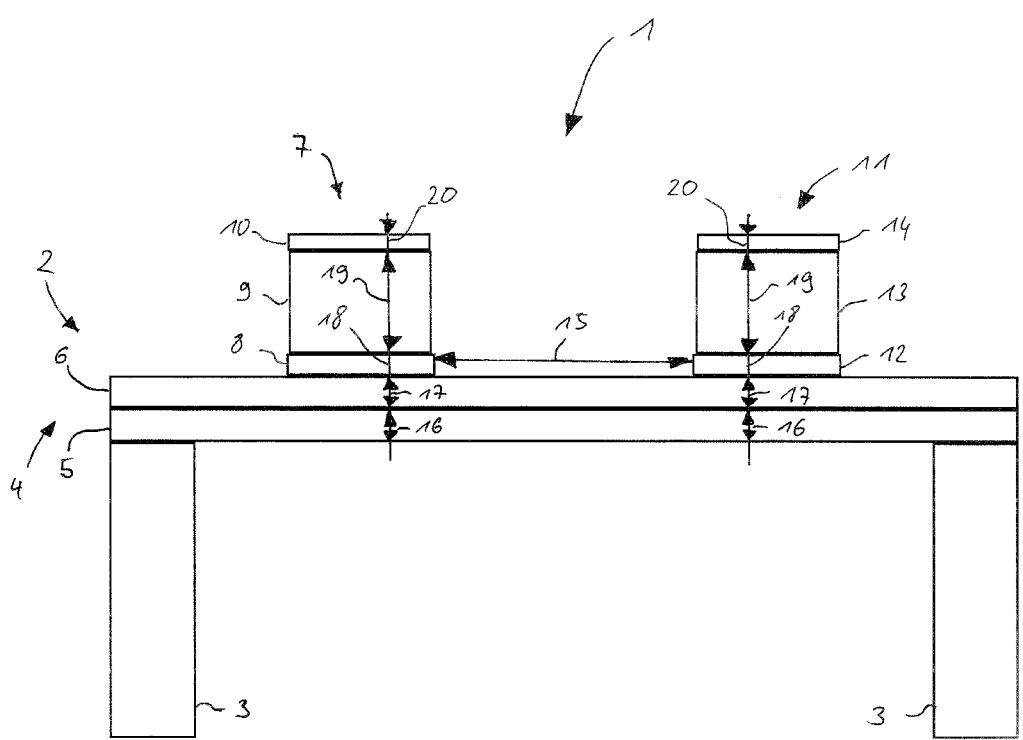
FIG. 1 shows a cross-section illustration of the embodiment of the microsystem made by the method according to the invention and FIG. 2 shows a top view of the embodiment from FIG. 1.
Figure 2:
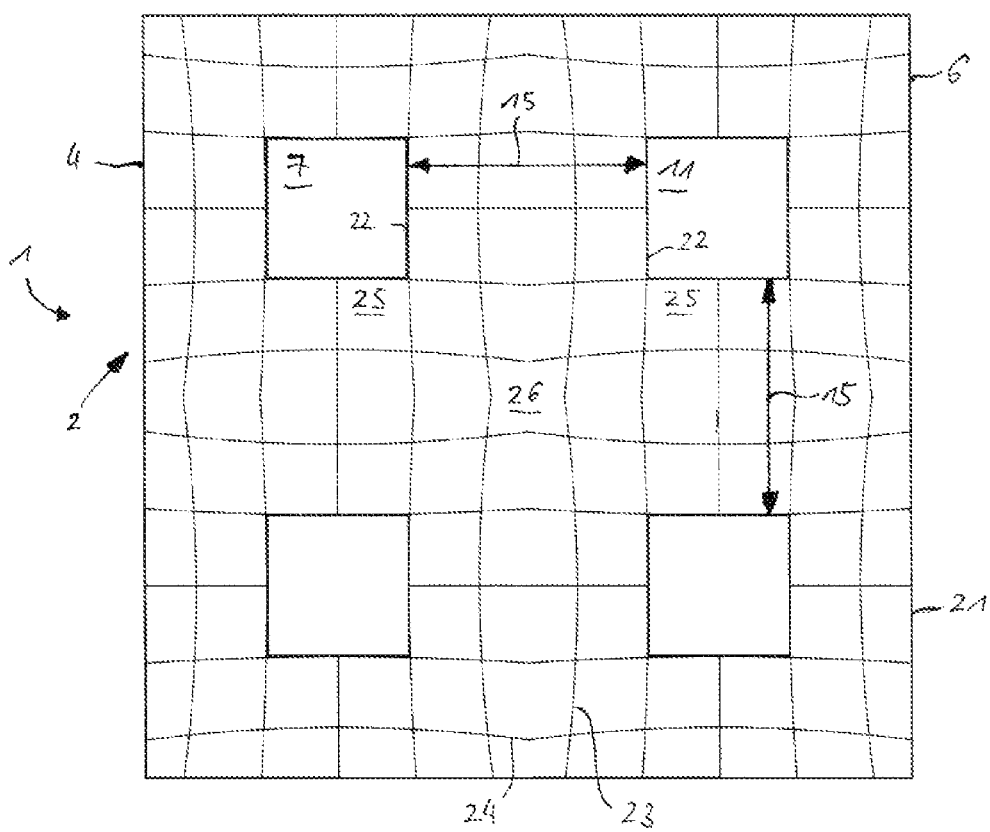

As can be seen from FIGS. 1 and 2, an infrared light sensor chip 1 made as a microsystem comprises a substrate 2 that in turn comprises a frame 3 and a membrane 4. The membrane 4 is attached on the frame 3 so that the membrane 4 is supported and spanned by the frame 3. The membrane 4 comprises a base layer 5 that is a thermal silicon oxide layer and a carrier layer 6 that is a silicon oxide thin layer.

A first infrared light sensor 7 with a first bottom electrode 8 made out of platinum, a first lead-zirconate-titanate pixel 9 with a high portion of zircon and a first head electrode 10 out of platinum as well as a second infrared light sensor 11 with a second bottom electrode 12 made out of platinum, a second lead-zirconate-titanate pixel 13 with a high portion of zircon and a second head electrode 14 made out of platinum are arranged on the carrier layer 6. The lead-zirconate-titanate pixels 9, 13 are respectively arranged between their bottom electrodes 8, 12 and their head electrodes 10, 14, wherein the bottom electrodes 8, 12 are arranged directly on the carrier layer 6.

The head electrodes 10, 14 are formed semitransparent, so that infrared light can impinge from outside on the lead-zirconate-titanate pixel 9, 13. The distance 15 between the infrared light sensors 7, 11 is chosen to be sufficiently long that the crosstalk between the infrared light sensors 7, 11 is within a still admissible magnitude. The base layer 5 has a thickness 16 between 200 nm and 1000 nm and the carrier layer 6 has a thickness 17 in the range of 100 nm to 700 nm, whereas the bottom electrodes 8, 12 have a thickness 18 from 40 nm to 200 nm. The lead-zirconate-titanate pixels 9, 13 have a thickness 19 of few micrometers, in particular from 2 to 5 μm. The head electrodes 10, 14 have a thickness 20 from 3 to 200 nm.

For producing the infrared light sensor chip, the following method is performed: The thermal silicon oxide layer is produced on the surface of a silicon wafer as the base layer 5 with the thickness 16 by oxidation of the silicon wafer. The silicon oxide thin layer is further produced directly on the base layer 5 as the carrier layer 6 by a thermal deposition method. A platinum layer is subsequently sputtered directly on the carrier layer 17 with the thickness 18 at a temperature between 300° C. and 550° C. Subsequently, a lead-zirconate-titanate layer is deposited directly on the platinum layer with a thermal deposition method and the thickness 19. Subsequently, a semi-transparent, electrically conductive electrode layer made out of platinum or a nickel-iron-compound or a nickel-chrome-compound is deposited directly on the lead-zirconate-titanate layer by a thermal deposition method and with a thickness 20.

Subsequently, the silicon wafer with the base layer 5, the carrier layer 6, the platinum layer the lead-zirconate-titanate layer, and the electrode layer is cooled to room temperature. It is alternatively possible to deposit the electrode layer on the lead-zirconate-titanate layer only after the cooling. Compressive stresses arise both in the base layer 5 and in the carrier layer 6 and tensile stresses arise in the platinum layer after the cooling. The compressive stresses in the carrier layer 6 are approximately five to ten times smaller than in the base layer 5 and the tensile stresses in the platinum layer are approximately 5 MPa to 20 MPa.

A pixel-like structuring is further carried out, wherein surplus areas of the platinum layer, of the lead-zirconate-titanate layer and of the electrode layer are removed, so that the infrared light sensors 7, 11 are formed at a distance 15 with respect to each other. Eventually a recess is made by material removal on the side of the silicon wafer facing away from the base layer, so that the frame 3 remains from the silicon wafer, wherein the membrane 4 is spanned by the frame 3 and formed by the base layer 5 and the carrier layer 6.

After the pixel-like structuring, tensile stresses are present in the bottom electrodes 8, 12 which values compared to the tensile stresses in the platinum layer are substantially unchanged before the structuring. On the locations of the carrier layer 6 and the base layer 5, on which the bottom electrodes 8, 12 are arranged, an overcompensation of the compressive stresses in the base layer 5 and the carrier layer 6 from the tensile stresses in the bottom electrodes 8, 12 results such that tensile stresses and no compressive stresses are present. The bottom electrodes 8, 12 with its tensile stresses therefore serve for the local compensation of the compressive stresses of the base layer 5 and the carrier layer 6. The local compensation of the compressive stresses of the base layer 5 and carrier layer 6 by the bottom electrodes 8, 12 arises, although the platinum layer is no longer continuously present on the surface of the carrier layer 6 after the structuring of the infrared light sensor. The tensile stresses that act on the carrier layer 6 and the base layer 5 due to the compensation effect of the bottom electrodes 8, 12 have values to about 50 MPa.

In FIG. 2, the compensation effect of the bottom electrodes 8, 12 is indicated with first and second grid lines 23, 24. If the compensation effect of the bottom electrodes 8, 12 would not be present, the grid lines 23, 24 would form a uniform grid, wherein the first grid lines 23 in FIG. 2 are perpendicular and parallel to the perpendicular sections of the edge 21 of the carrier layer 6 and the second grid lines 24 in FIG. 2 are oriented horizontally and parallel to the horizontal sections of the edge 21 of the carrier layer 6.

Due to the superposition of the tensile stresses in the bottom electrodes 8, 12 with the compressive stresses in the carrier layer 6 and the base layer 5, a distortion of the grid lines 23, 24 result, so that zones 25 with high tensile stress in the area of the edges 22 of the bottom electrodes 8, 12 in the carrier layer 6 and the base layer 5 and zones 25 with low tensile stress in the middle of the membrane 4 in the carrier layer 5 and the base layer 5 are formed.

Although the base layer 5 and the carrier layer are formed to be thin, the membrane 4 remains undamaged during the cooling to the room temperature. This is achieved by the compensation effect of the bottom electrodes 8, 12. The compensation effect mainly originates from the bottom electrodes 8, 12. The lead-zirconate-titanate pixels 9, 13 and the head electrodes 10, 14 analogously provide a contribution to the compensation effect. The contribution of the head electrodes 10, 14 is small compared to the contribution of the lead-zirconate-titanate pixels 9, 13, since the head electrodes 10, 14 are formed very thin due to their semitransparency. The gradients of the stresses in the membrane 4 are further sufficiently moderate that the membrane 4 has a high mechanical stability also after the cooling. The silicon oxide, out of which the carrier layer 6 and the base layer 5 are made, has advantageously such a low heat conductivity that crosstalk between the single infrared light sensors 7, 11 is low. The infrared light sensor chip 1 therefore has an advantageously high signal-to-noise ratio, in particular for frequencies that are smaller than the thermal limit frequency.

LIST OF REFERENCE SIGNS 1 pixel chip
2 substrate
3 frame
4 membrane
5 base layer
6 carrier layer
7 first pixel
8 first bottom electrode
9 first lead-zirconate-titanate pixel
10 first head electrode
11 second pixel
12 second bottom electrode
13 second lead-zirconate-titanate pixel
14 second head electrode
15 distance between the pixels
16 thickness of the base layer
17 thickness of the carrier layer
18 thickness of the bottom electrode
19 thickness of the lead-zirconate-titanate pixel
20 thickness of the head electrode
21 edge of the carrier layer
22 edge of the bottom electrode
23 first grid line
24 second grid line
25 zone with high tensile stress
26 zone with low tensile stress

What is claimed is:

1. A method for producing a microsystem with pixels, comprising:
   providing a silicon wafer;
   producing a thermal silicon oxide layer on the surface of the silicon wafer as a base layer with a thickness between 200 nm and 1000 nm by oxidation of the silicon wafer;
   producing a silicon oxide thin layer directly on the base layer as a carrier layer with a thickness between 100 nm and 700 nm by a thermal deposition method;
   producing a platinum layer directly on the carrier layer with a thermal deposition method with a thickness between 40 nm and 200 nm, whereby an intermediate product comprising the silicon wafer, the base layer, the carrier layer and the platinum layer is produced;
   cooling the intermediate product to room temperature;
   structuring the platinum layer with pixels by removing surplus areas of the platinum layer, whereby bottom electrodes of the pixels are formed in a pixel shape on the carrier layer in remaining areas;
   removing material on a side of the silicon wafer facing away from the base layer, so that a frame remains and a membrane formed by the base layer and the carrier layer is spanned by the frame; and
   finalizing of the microsystem.

2. The method according to claim 1, wherein the platinum layer is sputtered between 300° C. and 550° C.

3. The method according to claim 1, further comprising: producing a lead-zirconate-titanate layer directly on the platinum layer with a thermal deposition method and a thickness between 0.2 μm and 5 μm, whereby the intermediate product comprises the lead-zirconate-titanate layer.

4. The method according to claim 3, wherein during the pixel structuring of the platinum layer, the lead-zirconate-titanate layer is simultaneously structured by removing surplus areas of the lead-zirconate-titanate layer, whereby lead-zirconate-titanate pixel parts of the pixels are formed on the bottom electrodes in remaining areas of the lead-zirconate-titanate layer.

5. The method according to claim 3, further comprising: producing semi-transparent, electrically conductive electrode layer directly on the lead-zirconate-titanate layer with a thermal deposition method, whereby the intermediate product comprises the electrode layer.

6. The method according to claim 5, wherein the electrode layer comprises platinum or a nickel-iron-compound or a nickel-chrome-compound.

7. The method according to claim 6, wherein during the pixel structuring of the platinum layer and the lead-zirconate-titanate layer, the electrode layer is structured simultaneously by removing surplus areas of the second platinum layer, whereby head electrodes of the pixels are formed on the lead-zirconate-titanate pixel in remaining areas of the second platinum layer.

8. The method according to claim 1, wherein the thermal deposition method is a sputter method.

* * * * *